United States Patent [19]

Nienhuis

[11] 3,911,473

[45] Oct. 7, 1975

[54] IMPROVED SURFACE BREAKDOWN PROTECTION FOR SEMICONDUCTOR DEVICES

[75] Inventor: Rijkent Jan Nienhuis, Nijmegen, Netherlands

[73] Assignee: U.S. Philips Corporation, New York, N.Y.

[22] Filed: Aug. 14, 1972

[21] Appl. No.: 280,421

Related U.S. Application Data

[63] Continuation of Ser. No. 165,691, July 23, 1971.

[30] Foreign Application Priority Data

Oct. 12, 1968 Netherlands ...................... 6814636

[52] U.S. Cl. ...................... 357/52; 357/23; 357/53; 357/36; 357/13

[51] Int. Cl.$^2$.................... H01L 29/34; H01L 29/40

[58] Field of Search ........... 317/235 AH, 235 AM, 235 AG

[56] References Cited

UNITED STATES PATENTS

| | | | |
|---|---|---|---|
| 3,327,181 | 6/1967 | Williams | 317/235 |
| 3,337,783 | 8/1967 | Stehney | 317/235 |
| 3,391,287 | 7/1968 | Kao et al. | 307/302 |
| 3,544,861 | 12/1970 | Kooi | 317/235 |
| 3,576,478 | 4/1971 | Watkins | 317/235 |

*Primary Examiner*—Martin H. Edlow
*Attorney, Agent, or Firm*—Frank R. Trifari; Leon Nigohosian

[57] ABSTRACT

A semiconductor device having an improved surface breakdown voltage protection utilizes at least one guard junction around a planar base, an insulating layer over the guard junction, a conducting layer on the insulating layer around the base contact and lying between the base contact and the guard junction, and a conductive tab which is connected to the conductive layer and extends across the guard junction to make conductive contact with the collector.

1 Claim, 3 Drawing Figures

Figures 1, 2, 3:
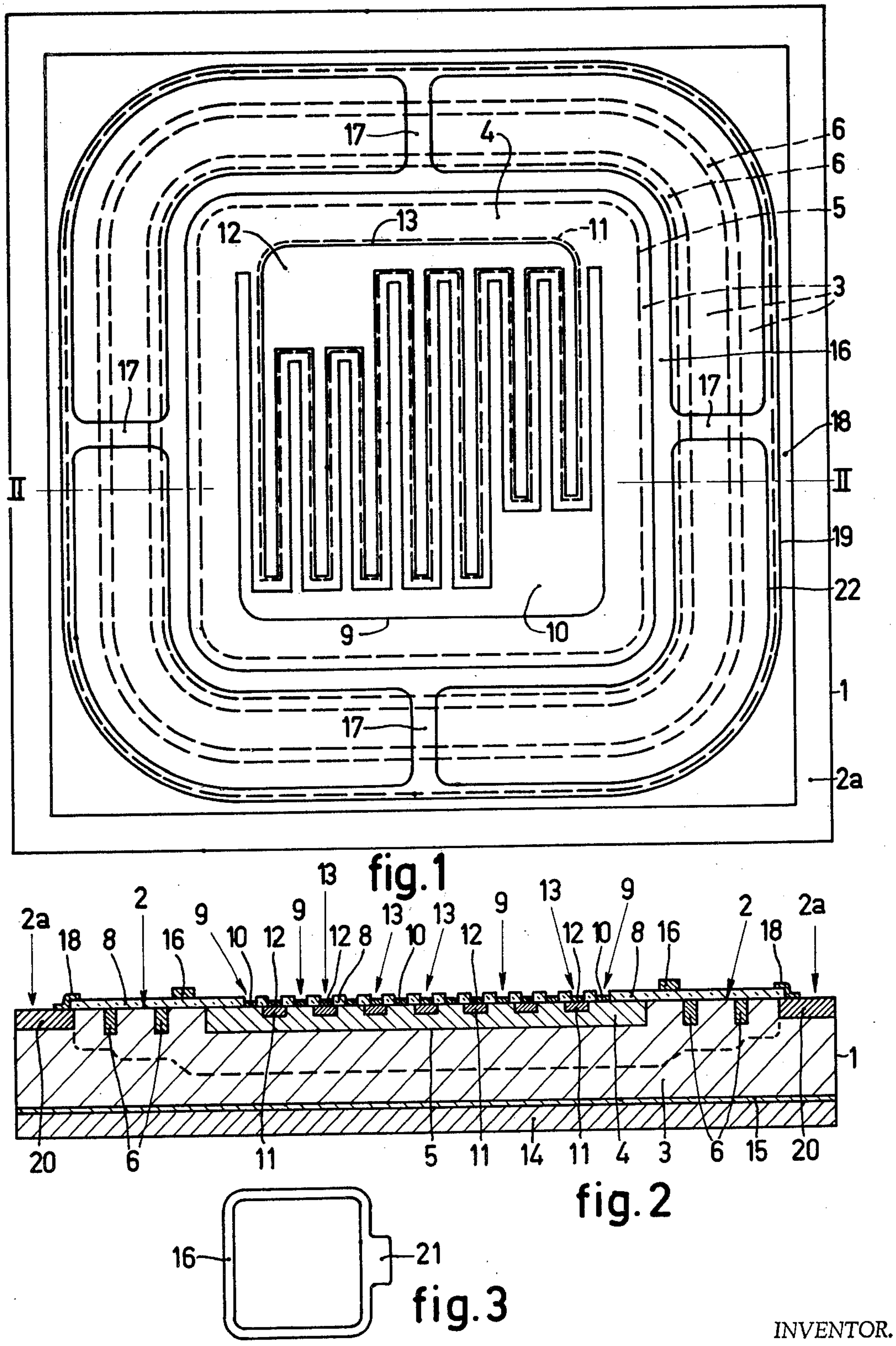

INVENTOR.
RIJKENT J. NIENHUIS
BY

AGENT

IMPROVED SURFACE BREAKDOWN PROTECTION FOR SEMICONDUCTOR DEVICES

This is a continuation of application Ser. No. 165,691, filed July 23, 1971.

The invention relates to a semiconductor device comprising a semiconductor body having a first region of one conductivity type adjoining a substantially flat surface of the body, a second region of the opposite conductivity type, adjoining said surface and surrounded entirely in the semiconductor body by the first region, the p-n junction between said regions terminating at the said surface, and, in order to increase the breakdown voltage between said regions, at least one further region of the other conductivity type situated beside the second region and adjoining the said surface and surrounded in the semiconductor body entirely by the first region, the p-n junction between the first and the further region terminating on the said surface and the further region surrounding the second region, an insulating layer being provided on the said surface and having an aperture in which a contact layer for the second region is provided.

Such semiconductor devices are described in French Pat. application 1,421,136. A first further region surrounds the second region at a short distance; if a second further region is present, it surrounds both the second region and the first further region; if a third further region is present it surrounds the second further region and so on. By providing such further regions it has been possible to considerably increase the breakdown voltage of the p-n junction between the first and the second region.

It has been found that semiconductor devices of the above-mentioned type are not stable particularly when they are embedded in a plastics envelope. During experiments as to lifetime, particularly at elevated temperatures, in which the p-n junction between the first and the second region is biased in the reverse direction, the break-down voltage of the p-n junction decreases.

One of the objects of the invention is to avoid this decrease of the breakdown voltage.

The invention is inter alia based on the recognition of the fact that the provision of the said further regions is not sufficient to obtain a stable, high breakdown voltage.

The invention is furthermore based on the recognition of the fact that during operation of a semiconductor device comprising further regions of the said type, in which the p-n junction is biased in the reverse direction, the insulating layer is charged electrically and tries to assume the potential of the contact layer as a result of which a thin surface layer of the opposite conductivity type is induced in the first region and connects the further region together and to the second region. As a result of this the breakdown-increasing effect of the further regions is removed.

According to the invention, a semiconductor device of the type mentioned in the preamble is characterized in that a conductive layer is provided on the insulating layer and comprises a first part which substantially entirely surrounds the contact layer and in which, in any direction parallel to the insulating layer, the distance(s) between the contact layer and the further region(s) is (are) larger than the distance between the contact layer and the first part, a second part which substantially entirely surrounds the further region(s) and is connected to a surface part of the first region which is free from the insulating layer and which, viewed from the second region, is situated beyond the further region(s) and at least a further part which connects the first part to the second part, in which the insulating layer between the first and the second part is covered by the conductive layer for a small part only.

During operation, the first part of the conductive layer which surrounds the contact layer intercepts the charge originating from the contact layer which otherwise would cause the said charge of the insulating layer, said charge being conducted to the first region. Because in this manner the charge of the insulating layer is prevented, no surface channels are formed which might adversely influence the breakdown increasing effect of the further region(s) which results in a stable semiconductor device, in which the breakdown voltage of the p-n junction does substantially not vary also during prolonged operation.

An insulating layer, for example, a silicon oxide layer, provided on a semiconductor body usually comprises a number of small holes which can substantially not be avoided and through which shortcircuit may occur between the semiconductor body and a conductor provided on the insulating layer.

In order to reduce the possibility of such a shortcircuit between the conductive layer and the semiconductor body, the insulating layer in the semiconductor device according to the invention between the first and the second part, is covered by the conductive layer preferably only for a small part.

In order to avoid any undesirable capacity between the conductive layer and the second region and to avoid large potential differences across the thickness of the insulating layer, as a result of which breakdown of said layer might occur, a further preferred embodiment according to the invention is characterized in that the conductive layer surrounds the second region and does not extend above said region.

The surface part situated beyond the further region(s), to which the conductive layer is connected electrically preferably surrounds said region(s) entirely.

An important embodiment of the semiconductor device according to the invention is characterized in that at least one innermost and one outermost further region are present, the outermost further region surrounding the innermost further region situated nearer to the second region, the conductive layer, is so far as it extends on the part of the insulating layer situated between the said further regions, belonging entirely to the further part(s) of the conductive layer by means of which the first part of the conductive layer is connected to the second part.

In order to enable a good electric connection between the conductive layer and the first region, a contact region is preferably provided in the first region having the same conductivity type as, but a lower resistivity than the first region and adjoining the surface part situated beyond the further region(s).

The first region preferably has n-type conductivity and the second and further region(s) show p-type conductivity.

The invention is of particular importance for high voltage transistors in which the first region is the collector region of a transistor and the second region is the base region of said transistor.

In order that the invention may be readily carried into effect, a few examples thereof will now be described in greater detail, with reference to the accompanying drawing, in which FIG. 1 is a diagrammatic plan view of an example of a semiconductor device according to the invention, and FIG. 2 is a diagrammatic cross-sectional view taken on the line II—II in FIG. 1.

It is to be noted that in FIG. 1 the semiconductor regions in the semiconductor body 1 are shown in broken lines.

The example to be described hereinafter relates to a transistor.

The transistor shown in FIGS. 1 and 2 has a semiconductor body 1 comprising a first region 3 of one conductivity type, the collector region, adjoining a flat surface 2 of the body, a region 4 of the opposite conductivity type, the base region, adjoining the surface 2, which region in the body 1 is fully surrounded by the first region 3, while the p-n junction 5 between the regions 3 and 4 terminates at the surface 2. In order to increase the breakdown voltage between the regions 3 and 4, further regions 6, in the present example two, of the opposite conductivity type are provided beside the second region 4 and adjoin the surface 2 and are surrounded in the body 1 entirely by the region 3, while the p-n junctions 7 between the regions 6 and the region 3 terminate at the surface 2. The further regions 6 surround the second region 4. An insulating layer 8 is provided on the surface 2 and comprises an aperture 9 in which a contact layer 10 for the second region 4 is provided.

Furthermore, an emitter region 11 in the form of a comb is provided in the base region 4 and adjoins the surface 2. The emitter region is provided with a contact layer 12 is an aperture 13 of the insulating layer 8.

Connection conductors (not shown) can be connected to the contact layers 10 and 12. The electric connection for the collector region 3 is constituted by the metal supporting plate 14, on which the body 1 is secured by means of a layer 15 of solder.

In so far as the transistor shown in FIGS. 1 and 2 has been described, it is of a conventional type and can be manufactured in a manner conventional in semiconductor technology while using conventional materials.

The semiconductor body 1 is, for example, a monocrystalline silicon crystal, having dimensions of 750 $\mu$m × 750 $\mu$m × 80 /$\mu$m. The collector region 3 preferably has n-type conductivity. The resistivity is, for example, 20 ohm. cm. The further regions 6 and the base region 4 have p-type conductivity and have been obtained simultaneously by the diffusion of boron. The emitter region 11 has n-type conductivity and has been obtained by the diffusion of phosphorus. In the plan view shown in FIG. 1 the base region 4 has dimensions of 460 $\mu$m × 460 $\mu$m, the width of the digits of the emitter regions 11 is approximately 25 $\mu$m× the further regions 6 is approximately 10 $\mu$m, the distance between the base region 4 and nearest further regions 6 and between the further region 6 is approximately 25 $\mu$m. The thickness of the base region 4 and the further regions 6 is approximately 6 $\mu$m and that of the emitter region 11 approximately 4 $\mu$m.

The insulating layer 8 consists of silicon oxide and has a thickness of approximately 2 $\mu$m. This layer may also consist, for example, of silicon nitride. The body 1 is secured to the metal supporting plate 14, for example, of gold-plated molybdenum, by means of any conventional solder to obtain a substantially ohmic contact. The contact layers 10 and 12 are of aluminium.

The collector breakdown voltage of the transistor described is not stable. Experiments performed in connection with the invention have demonstrated that during a prolonged operation, in which the collector-base junction 5 is biased in the reverse direction, that is to say, in which a negative potential with respect to the potential of the metal plate 14 is applied to the contact layer 13, the insulating layer 8 is negatively charged, so that a p-type surface layer is induced in the collector region 3, which layer connects the base region 4 to the regions 6, and the breakdown-increasing effect of the regions 6 is removed.

In order to imporve the stability of said breakdown voltage, according to the invention a conductive layer 16, 17, 18 is provided on the insulating layer 8 and surrounds the contact layer 10 of the second region 4 in which, in any direction parallel to the insulating layer 8, the distances between the contact layer 10 and the further regions 6 are larger than the distance between the contact layer 10 and the conductive layer 16, 17, 18.

By applying a positive potential with respect to the contact 10 to the conductive layer 16, 17, 18 which surrounds the contact layer 10, so a less negative or even a positive potential, the negative charge of the insulating layer 8 is restricted or prevented. The most favourable results are obtained when the potential difference between the conductive layer 16, 17, 18 and the collector region 3 is small. Therefore, an electric connection is provided between said conductive layer and the first region 3.

In the present example, the conductive layer 16, 17, 18 is electrically connected to a surface part 2*a* of the first region 3 which is free from the insulating layer 8 and which, viewed from the second region 4, is situated beyond the further regions 6. This surface part 2*a* surrounds the further region 6 and the edge of the insulating layer 8 is denoted by 19 in FIG. 1. Due to this electric connection the same potential is automatically applied during operation to the conductive layer 16, 17, 18 as to the collector region 3. The conductive layer 16, 17, 18 must not be connected to a surface part of the collector region 3 between the further regions 6 or between the base region 4 and the nearest further region 6, since during operation a depletion region extends from the p-n junction 5 along said surface parts in the collector region 3.

If the conductive layer 16, 17, 18 should extend to above the base region 4, the base-collector capacity would be increased by it and the base-collector voltage would be applied across the thickness of the insulating layer 8 during operation, so that a possibility of breakdown of said layer might occur. Therefore the conductive layer 16, 17, 18 surrounds the second region (base region) 4 and does not extend above said region 4.

In order to restrict the possibility of shortcircuit between the conductive layer 16, 17, 18 and the underlying semiconductor material via a pinhole in the insulating layer 8, the surface of the conductive layer 16, 17, 18 is preferably small. The conductive layer 16, 17, 18 therefore consists of a first part 16, which surrounds the second region 3 and in which, in any direction parallel to the insulating layer 8, the distances between the contact layer 10 and the further regions 6 are larger than the distance between the contact layer 10 and the first part 16, of a second part 18 which surrounds the further regions 6 and is connected to the surface part 2*a* situated beyond said regions 6, and of the further regions 17 which interconnect the parts 16 and 18, in which between the parts 16 and 18 the insulating layer 8 is covered only for a small part by the conductive layer 16, 17, 18. Use is made of the fact that the stability-increasing effect of the conductive layer, has a lesser dependence on the influence of the electric field in the surface part of the semiconductor body situated below the conductive layer, do to the potential applied to the conductive layer, than on the interception and removal of change originating from the contact metal layer 10 which might charge the insulating layer 8. The first part 16 is situated entirely between the second region 4 and the further regions 6.

In the first region 3 (collector region) a contact region 20 is provided which has the same conductivity type (n-type) as, but a lower resistivity than the first region 3 and which adjoins the surface part 2*a*, situated beyond the further regions 6. As a result of this the electric resistance between the conductive layer 16, 17, 18 and the first region 3 is reduced.

The contact region 20 furthermore prevents the depletion layer, which during operation extends in the collector region, from extending up to the edge of the crystal as a result of which leakage currents might occur.

In FIG. 2 the form of the depletion layer occurring during operation in the collector region 3 is shown in broken lines.

The conductive layer 16, 17, 18 consists of aluminium and can be provided simultaneously with the contact layer 10 and 12. The n-type contact region 20 can be obtained by diffusion of, for example, phosphorus, and can be provided simultaneously with the emitter region 11.

The transistor described according to the invention has a high, stable base-collector breakdown voltage.

The transistor can be completed in any conventional manner and can be provided with an envelope.

The invention is not only of importance for transistors but, for example, also for high-voltage diodes. When in the transistor described the emitter region 11 and the contact layer 12 are omitted, in principle a high-voltage diode according to the invention has been obtained.

The means for applying the desirable potentials are not shown in the Figures since such means are generally known.

It will be obvious that the invention is not restricted to the examples described and that many variations are possible to those skilled in the art without departing from the scope of the present invention. The apertures 22 between the parts 16, 17, 18 of the conductive layer shown in FIG. 1 may have a different form. It is not necessary for the conductive layer to fully surround the contact layer of the second region. A small interruption in the said surrounding will have little or no influence on the effect of the said layer. The number of further regions 6 need not be two, a larger number is possible and also only one is possible. The shape of the conducting layer 16 for a semiconductor device using only one further region 6 is shown in FIG. 3. Electrical contact from surface 2*a* to the conducting layer 16 in FIG. 3 is made through tab 21. The emitter region of the transistor shown in FIGS. 1 and 2 may have any conventional shape. Conventional materials other than those mentioned may also be used, for example, a semiconductor body of germanium or a III–V-compound The exposed surface part 2*a* nor the contact region 20 need extend up to the edge of the semiconductor body 1 as is shown in FIGS. 1 and 2. The base contact layer 10 may extend to above the collector region 3, the whole line of intersection of the p-n junction 5 with the surface 2 lying below the base contact layer 10.

What is claimed is:

1. A semiconductor device having a semiconductor body comprising a first region of one conductivity type adjoining a substantially flat surface of the semiconductor body, a second region of opposite conductivity type adjoining said surface and being entirely surrounded by the first region within the semiconductor body to form a first p-n junction between the first and the second regions, said first p-n junction terminating at said surface, at least one further region of said opposite conductivity type being situated beside the second region, adjoining said surface, and being entirely surrounded by the first region within the semiconductor body to form a second p-n junction between the first region and the further region, said p-n junction terminating at said surface, said further region surrounding the second region, an insulating layer on said surface, said insulating layer having a contact window at which there is provided an electrical contact for the second region, a conductive layer disposed on the insulating layer, said conductive layer substantially surrounding the second region, the distance from said electrical contact along a line measured parallel to the insulating layer to the further region exceeding the distance along the line to the conductive layer, and means to connect the conductive layer to a surface part of the first region which is free from the insulating layer and is beyond the further region with respect to the contact layer, so that said conductive layer conducts to said first region charges originating at said electrical contact, said device further comprising a second further region of said opposite conductivity type that is situated beside the first further region, said second further region adjoining said surface and being entirely surrounded by the first region within the semiconductor body to form a third p-n junction between the first region and the second further region, said third p-n junction terminating at said surface, said second further region surrounding the first further region, a second conductive layer on the insulating layer which substantially surrounds the second further region, and means to connect the first conductive layer to the second conductive layer, said connection means comprising a third conductive layer on the insulating layer at most partly covering the surface of the insulating layer laying above said between the first and the second further regions.

* * * * *